(12) United States Patent
Tsang

(10) Patent No.: US 8,461,599 B2
(45) Date of Patent: Jun. 11, 2013

(54) LIGHT EMITTING DIODE WITH A STABLE COLOR TEMPERATURE

(75) Inventor: Jian-Shihn Tsang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 22 days.

(21) Appl. No.: 13/102,056

(22) Filed: May 6, 2011

(65) Prior Publication Data

US 2012/0138959 A1 Jun. 7, 2012

(30) Foreign Application Priority Data

Dec. 1, 2010 (TW) .............................. 99141816 A

(51) Int. Cl.
*H01L 27/15* (2006.01)
(52) U.S. Cl.
USPC .................... 257/80; 257/82; 257/81; 257/84

(58) Field of Classification Search
USPC ......................................................... 315/149
See application file for complete search history.

(56) References Cited

U.S. PATENT DOCUMENTS

| 4,266,334 | A  | * | 5/1981  | Edwards et al. | ................. | 438/64  |
| 2004/0257355 | A1 | * | 12/2004 | Naugler        | .........................| 345/204 |
| 2005/0200292 | A1 | * | 9/2005  | Naugler et al. | ...............           | 315/149 |
| 2009/0273005 | A1 | * | 11/2009 | Lin            | .................         | 257/99  |
| 2012/0138962 | A1 | * | 6/2012  | Tsang          | .............             | 257/81  |

* cited by examiner

*Primary Examiner* — Cheung Lee
*Assistant Examiner* — Christopher Johnson
(74) *Attorney, Agent, or Firm* — Altis Law Group, Inc.

(57) ABSTRACT

A light emitting diode (LED) with a stable color temperature includes at least one LED chip and at least one color sensor module. The LED chip has a main light emitting surface and a sub light emitting surface opposite to the main surface. The color sensor module senses the intensities of light emitting from sub light emitting surface of the LED chip for adjustment of a color temperature of the LED.

14 Claims, 3 Drawing Sheets

LIGHT EMITTING DIODE WITH A STABLE COLOR TEMPERATURE

BACKGROUND

1. Technical Field

The disclosure relates to light emitting diodes, and particularly to a light emitting diode with a stable color temperature.

2. Description of the Related Art

Light emitting diodes (LEDs) have many advantages, such as high luminosity, low operational voltage, low power consumption, compatibility with integrated circuits, easy driving, long term reliability, and environmental friendliness have promoted their wide use as a light source. Now, LEDs are commonly applied in environmental lighting. It is well known that color temperature and intensity of the LEDs are affected by the variations in the temperature of the LEDs. Thus, how to stabilize the color temperature and intensity of the light emitting diode are substantially important issues.

Therefore, it is desirable to provide an LED with a stable color temperature which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present light emitting diode with a stable color temperature. Moreover, in the drawings, like reference numerals designate corresponding parts throughout the views.

FIG. 3 is a cross section view of a light emitting diode with a stable color temperature in accordance with a third embodiment.

DETAILED DESCRIPTION

Embodiments of a light emitting diode (LED) with a stable color temperature as disclosed are described in detail here with reference to the drawings.

Figure 1:
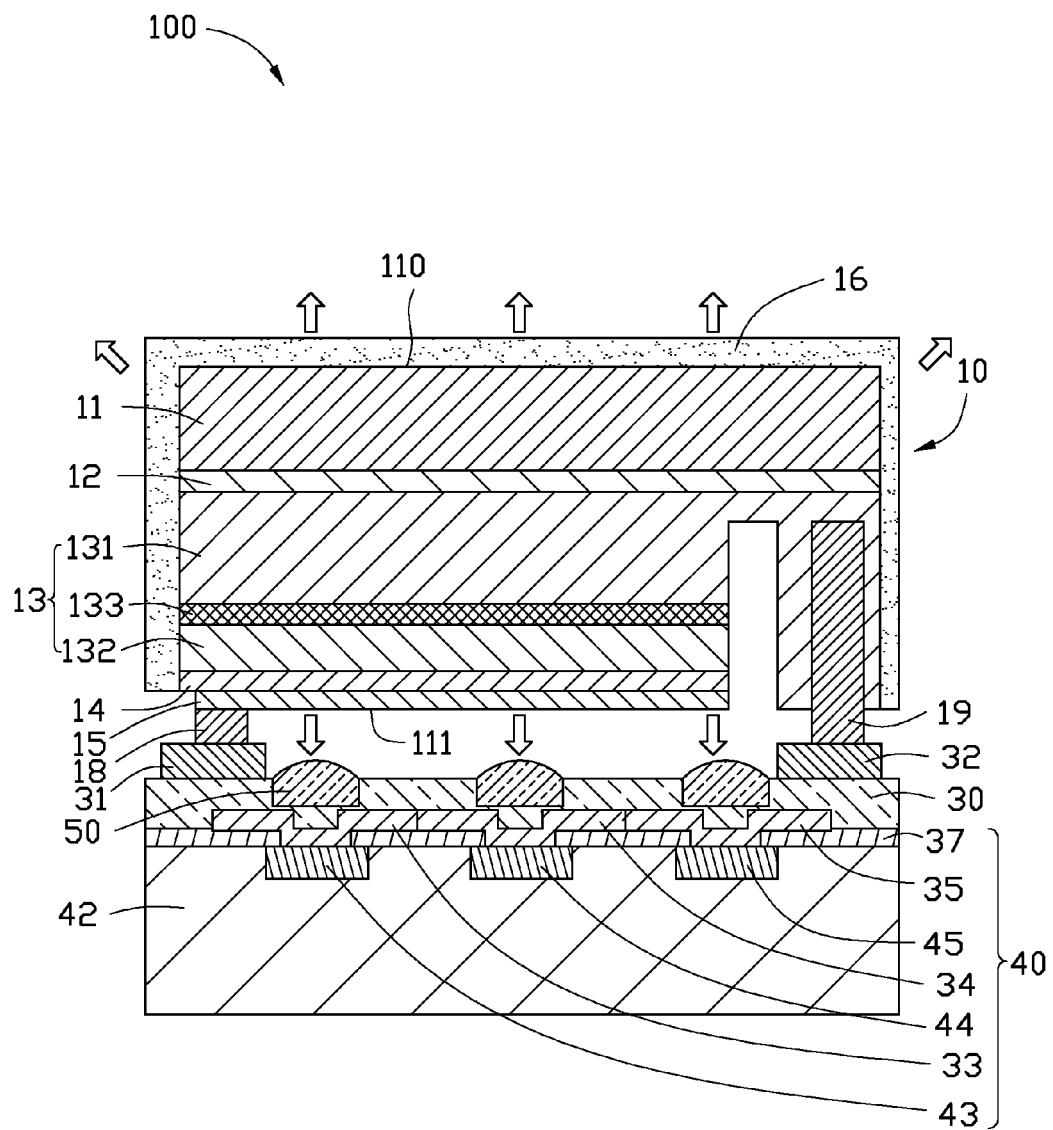
FIG. 1 is a cross section view of a light emitting diode with a stable color temperature in accordance with a first embodiment.

Referring to FIG. 1, an LED with a stable color temperature 100 in accordance with a first embodiment includes an LED chip 10, a color sensor module 40, a transparent, electrically insulating layer 30 connected between the LED chip 10 and the color sensor module 40.

The light emitting diode chip 10 in this embodiment is a flip-chip. The light emitting diode chip 10 includes a substrate 11, a light emitting structure 13, a first electrode 18, and a second electrode 19. A buffer layer 12 is grown between the substrate 11 and the light emitting structure 13. The buffer layer 12 is made of GaN material in this embodiment. A p type contact layer 14 and a transparent conductor layer 15 are arranged between the light emitting structure 13 and the first electrode 18. The substrate 11 is arranged, on one side of the light emitting structure 13 away from the color sensor module 40. The lighting emitting structure 13, the p type contact layer 14, and the transparent conductor layer 15 sequentially extend from the substrate 11 to the color sensor module 40. The light emitting diode chip 10 has a main light emitting surface 110 and a sub light emitting surface 111 opposite to the main surface 110. The main surface 110 is a surface of the LED chip 10 near the substrate 11. The sub light emitting surface 111 is a surface near the transparent conductor layer 15.

The substrate 11 is a transparent plate. The substrate 11 is a high transmittance material, such as sapphire, $Si_3N_4$, GaN, ZnO. In this embodiment, the substrate 11 is sapphire.

The light emitting substrate 13 includes a first semiconductor layer 131, a second semiconductor layer 132, and an active layer 133 between the first semiconductor layer 131 and the second semiconductor layer 132. The first semiconductor layer 131 is an n type GaN semiconductor layer. The second semiconductor layer 132 is a p type GaN semiconductor layer. The active layer 133 is a region of multiple quantum wells (MQWs). A fluorescent powder layer 16 is arranged on a top surface and a side surface of the LED chip 10. The fluorescence powder layer 16 is composed of yellow fluorescent powder in this embodiment.

The first electrode 18 connects to a bottom of the transparent conductor layer 15. The second electrode 19 connects to the first semiconductor layer 131. The first electrode 18 and the second electrode 19 are metal conductor electrodes.

The transparent, electrically insulating layer 30 can be made of epoxy, silicon, spin-on glass (SOG), polyimide, B-staged bisbenzocyclobutene (BCB), or glass. A first welding pad 31 arranged on the transparent, electrically insulating layer 30 is corresponding to the first electrode 18. A second welding pad 32 arranged on the transparent, electrically insulating layer 30 is corresponding to the second electrode 19. The first welding pad 31 and the second welding pad 32 are for electrically connecting to an external circuit (not shown). The first welding pad 31 connects to the first electrode 18 and the second welding pad 32 connects to the second electrode 19 by eutectic method.

The color sensor module 40 includes a color filter layer arranged on one side surface of the transparent, electrically insulating layer 30 away from the LED chip 10, a reflection layer 37, and a color detector (not labeled). The color filter layer in this embodiment can be a red color filter layer 33, a green color filter layer 34, and a blue color filter layer 35. The red color filter layer 33, the green color filter layer 34, and the blue color filter layer 35 are mutually parallel and coplanar. The red color filter layer 33, the green color filter layer 34, and the blue color filter layer 35 include a periphery portion (not labeled) embedded in the transparent, electrically insulating layer 30 and a central portion (not labeled) protruding downwardly out of the transparent, electrically insulating layer 30.

The reflection layer 37 is arranged on one side surface of the transparent, electrically insulating layer 30 away from the LED chip 10 and parallel to the color filter layer. The reflection layer 37 covers the transparent, electrically insulating layer 30 and the periphery portions of the red color filter layer 33, the green color filter layer 34, and the blue color filter layer 35. The reflection layer 37 is made of metal material and prevents the light from the LED chip 10 from going through the color filter layers, except for the central protrusion portions thereof.

The color detector in this embodiment is a back side illumination detector including a red color light detector 43, a green color light detector 44, and a blue color light detector 45. The red color light detector 43, the green color light detector 44, and the blue light color detector 45 arranged on one side surface of the color filter layers away from the LED chips 10 are respectively corresponding to the red color filter layer 33, the green color filter layer 34, and the blue color filter layer 35. The red color light detector 43, the green color light detector 44, and the blue color light detector 45 are received into a silicon plate 42. A wire (not shown) arranged in the silicon plate 42 connects the light detectors 43, 44, 45 to an external driving circuit (not shown). The red color light detector 43, the green color light detector 44, and the blue color light detector 45 detect intensities of light from the light emitting diode chip 10 respectively traveling through the central protrusion portions of the red color filter layer 33, the green color filter layer 34, and the blue color filter layer 35. Thus, the driving circuit can exert control according to the intensities of the three different colored lights When a variation of color temperature or intensity of light from the LED chip 10 occurs due to the weakened of the LED chip 10, the color sensor module 40 can detect the variation. Thus, the driving circuit can modify electrical parameters in order to stabilize intensity and color temperature of the LED chip 10. The red color light detector 43, the green color light detector 44, and the blue color light detector 45 are photoelectric diodes.

A plurality of lenses 50 are arranged on one side surface of the transparent, electrically insulating layer 30 near the LED chips 10. Each lens 50 on a corresponding one of the red color filter layer 33, the green color filter layer 34, and the blue color filter layer 35 converges light through the red color filter layer 33, the green color filter layer 34, and the blue color filter layer 35. Thus, intensity of light entering into the red color light detector 43, the green color light detector 44, and the blue light color detector 45 is enhanced.

Understandably, the LED chip 10 can be a low power LED, a high power LED, an AC LED, a high voltage LED, an AC high Voltage LED or a multichip LED. Light form the LED chip 10 can be monochromatic light, such as a red light. Therefore, the LED chip 10 can be a red LED chip, and the color detectors can be red color light detectors.

Understandably, the lenses 50 and the color filter layer can directly fix on the color detectors. The first electrode 18 and the second electrode 19 of the LED chip 10 are directly fixed on the color sensor module 40.

Figure 2:
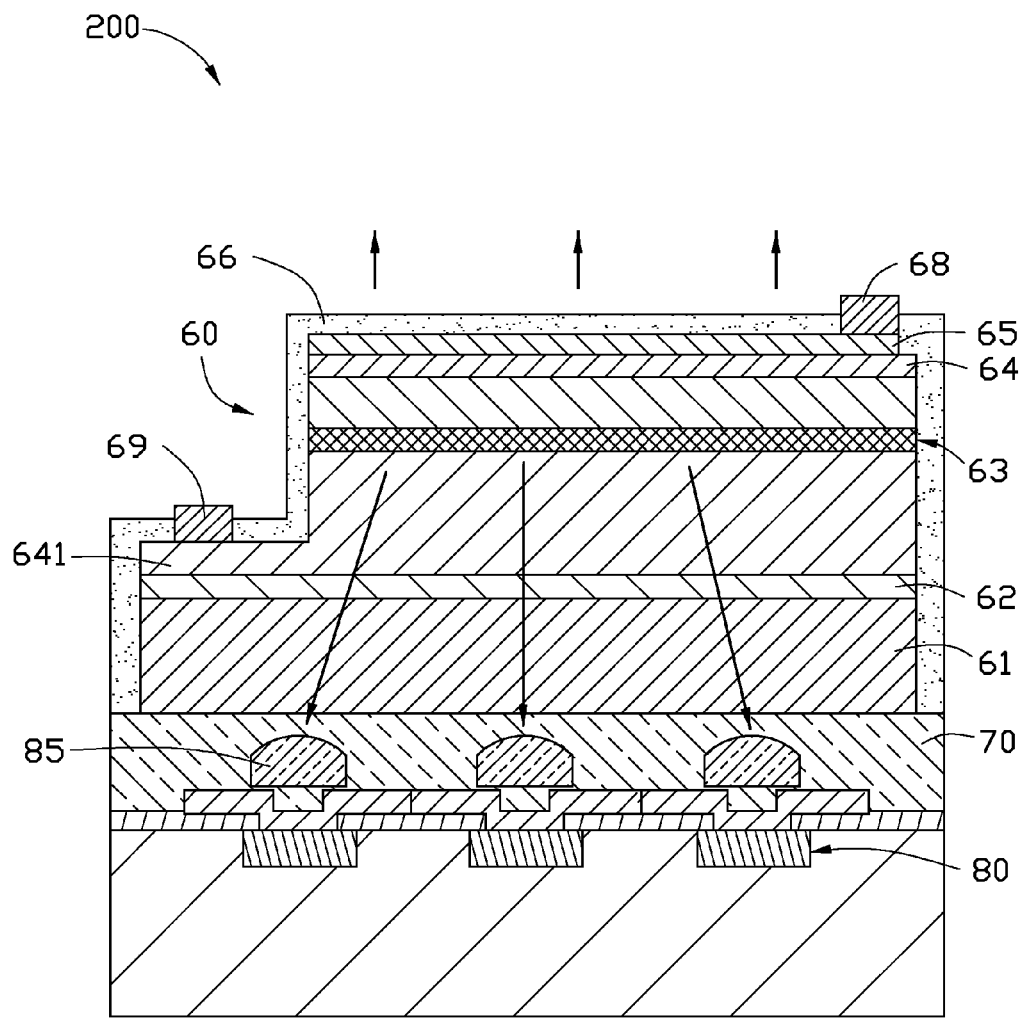
FIG. 2 is a cross section view of a light emitting diode with a stable color temperature in accordance with a second embodiment.

Referring to FIG. 2, an LED with a stable color temperature 200 in accordance with a second embodiment includes an LED chip 60, a color sensor module 80, a transparent, electrically insulating layer 70 between the LED chip 60 and the color sensor module 80; the second embodiment differs from the first embodiment only in that the LED with a stable color temperature 200 includes a different arrangement regarding electrodes 68, 69 thereof and the LED chip 60.

The LED chip 60 includes a substrate 61 connected to the transparent, electrically insulating layer 70, a buffer layer 62, a light emitting structure 63, a p type semiconductor contact layer 64, a transparent conductor layer 65, an n type semiconductor contact layer 641, a first electrode 68 connected to the transparent conductor layer 65, and a second electrode 69 connected to the n type semiconductor contact layer 641. The first electrode 68 and the second electrode 69 are used for electrically connecting to an external circuit by wires (not shown).

A fluorescent powder layer 66 is arranged on a top surface and a side surface of the LED chip 60. The fluorescent powder layer 66 is full of yellow fluorescence powders. The lenses 85 arranged inside the transparent, electrically insulating layer 70 are corresponding to the color sensor module 80.

A part of the light from the LED chip 60 emits down through the buffer layer 62, the substrate 61, the transparent, electrically insulating layer 70 and the lenses 85 to the color sensor module 80. The intensities and the color temperature of the LED chip 60 detected by the color sensor module 80 feed back to the driving circuit (not shown). When the detected value exceeds the predetermined value, the intensities and color temperature of the LED chip 60 are adjusted by controlling the circuit.

Figure 3:
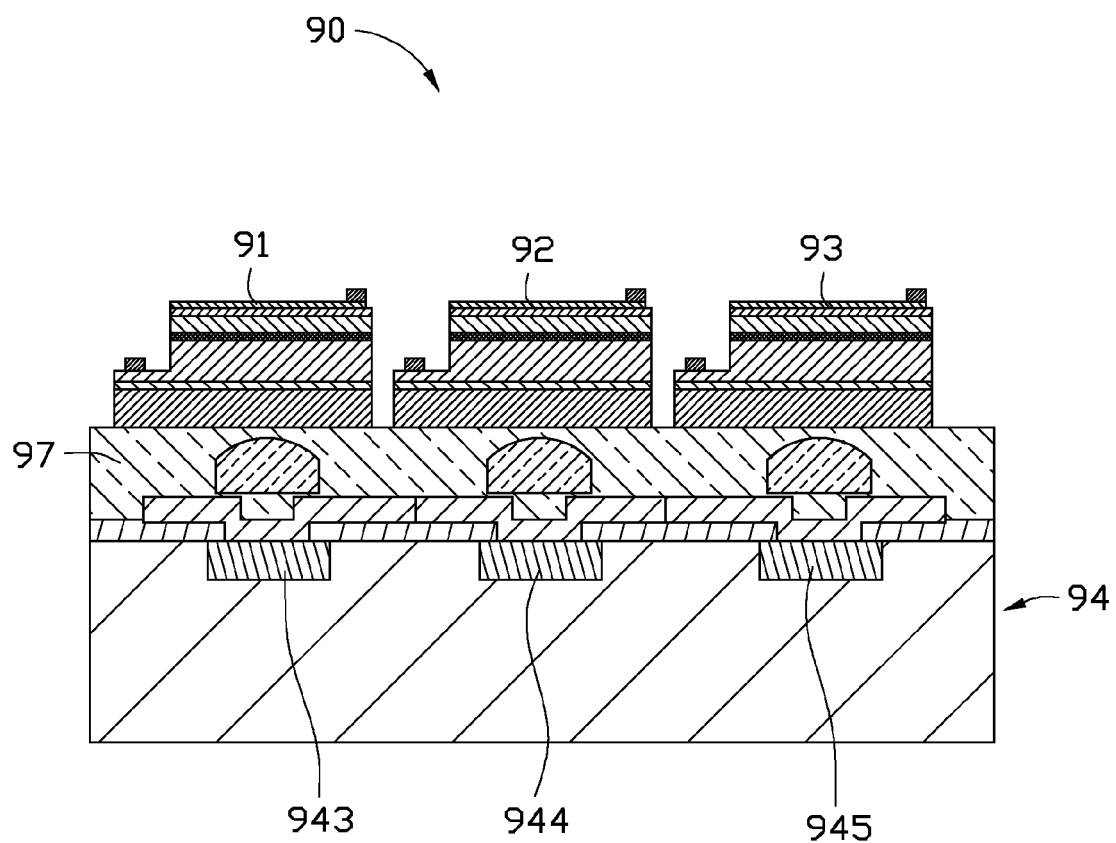
FIG. 3 is

Referring to FIG. 3, an LED with a stable color temperature 90 in accordance with a third embodiment includes a color sensor module 94, a transparent, electrically insulating layer 97, a red color LED chip 91, a green color LED chip 92, and a blue color LED chip 93. The red color LED chip 91, the green color LED chip 92, the blue color LED chip 93 are arrayed and spaced at intervals on the color sensor module 94. The color sensor module 94 which is the same with the color sensor module 80 of the second embodiment includes a red color light detector 943 corresponding to the red color light emitting diode chip 91, a green color light detector 944 corresponding to the green color light emitting diode chip 92, and a blue color light detector 945 corresponding to the blue color light emitting diode chip 93.

Light from the red color LED chip 91, the green color LED chip 92, and the blue color LED chip 93 are respectively detected by the red color light detector 943, the green color detector light 944, and the blue color light detector 945. Thus, the driving circuit can control the intensity and the color temperature of light from the LED with a stable color temperature 90 according to signals of the color sensor module 80.

Understandably, the red color LED chip 91, the green color LED chip 92, and the blue color LED chip 93 can be in a triangular array. The red color light detector 943, the green color light detector 944, and the blue color light detector 945 in a triangular array respectively correspond to the red color LED chip 91, the green color LED chip 92, and the blue color LED chip 93 also in a triangular array.

Understandably, the LED with a stable color temperature 90 which combines three color LED chips 91, 92, 93 emits white light.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode with a stable color temperature, comprising:
   at least one LED chip having, is main light emitting surface and a sub light emitting surface opposite to the main light emitting surface;
   at least one color sensor module positioned under the at least one LED chip;
   a fluorescent powder layer arranged on a top surface and a side surface of the at least one LED chip; and
   a first electrode and a second electrode for electrical connection, wherein the at least one color sensor module is located between the first electrode and the second electrode;
   wherein the color temperature of at least one LED chip is adjusted according to intensities of light from the sub light emitting surface of the at least one LED chip detected by the at least one color sensor module.

2. The light emitting diode with a stable color temperature of claim 1, wherein the at least one color sensor module includes a color filter layer and at least one color detector, the light from the sub light emitting surface of the at least one LED chip traveling through the color filter layer and further detected by the at least one color detector.

3. The light emitting diode with a stable color temperature of claim 2, wherein the at least one color sensor module comprises a reflection layer parallel to the color filter layer.

4. The light emitting diode with a stable color temperature of claim 2, wherein the at least one color detector is a back side illumination detector consisting of at least one photoelectric diode.

5. The light emitting diode with a stable color temperature of claim 2, wherein the at least one LED chip comprises three LED chips which are respectively as red color LED chip, a green color LED chip and as blue color LED chip, the at least one color detector includes three color detectors which are respectively a red color light detector corresponding to the red color LED chip, a green color light detector corresponding to the green color LED chip, and a blue color light detector corresponding to the blue color LED chip.

6. The light emitting diode with a stable color temperature of claim 1, wherein the at least one color sensor module further comprises at least one lens corresponding to the at least one color detector.

7. A light emitting diode with a stable color temperature, comprising:
    a silicon plate;
    a transparent, electrically insulating layer positioned on the silicon plate;
    a color sensor modulo embedded between the silicon plate and the transparent, electrically insulating layer; and
    a plurality of LED chips positioned on the transparent, electrically insulating layer, wherein each of the plurality of the LED chips comprises two electrodes for electrical connection, and the color sensor module is located between two outermost ones of the electrodes of the plurality of LED chips;
    wherein the color temperature of the LED chips is adjusted according to intensities of light generated from the LED chips and further detected by the color sensor module.

8. The light emitting diode with a stable color temperature of claim 7, wherein the color sensor module comprises a plurality of color filter layers and a plurality of color detectors located under the plurality of color filter layers, the light generated from the plurality of LED chips traveling through the plurality of color filter layers and further detected by the plurality of color detectors.

9. The light emitting diode with a stable color temperature of claim 7, wherein the color sensor module comprises a reflection layer parallel to the plurality of color filter layers.

10. The light emitting diode with a stable color temperature of claim 7, wherein each of the color detectors is a back side illumination detector consisting of a photoelectric diode.

11. The light emitting diode with a stable color temperature of claim 7, wherein the plurality of LED chips comprises three LED chips which are respectively a red color LED chip, a green color LED chip and a blue color LED chip, the plurality of detectors comprises three color detectors which are respectively a red color light detector corresponding to the red color LED chip, a green color light detector corresponding to the green color LED chip, and a blue color light detector corresponding to the blue color LED chip.

12. The light emitting diode with a stable color temperature of claim 7, wherein the color sensor module further comprises a plurality of lenses corresponding to the plurality of color detectors.

13. The light emitting diode with a stable color temperature of claim 7, wherein the plurality of LEDs are arranged as a triangular array.

14. The light emitting diode with a stable color temperature of claim 11, wherein the red color LED, the green color LED and the blue color LED cooperate to emit white light.

\* \* \* \* \*